(12) United States Patent
Fichtner et al.

(10) Patent No.: US 12,740,090 B2
(45) Date of Patent: Sep. 15, 2026

(54) ELECTRONIC COMPONENT, METHOD FOR THE CONTROL THEREOF, AND METHOD FOR PRODUCING AN ELECTRONIC COMPONENT

(71) Applicant: Fraunhofer-Gesellschaft zur Förderung der angewandten Forschung e.V., Munich (DE)

(72) Inventors: Simon Fichtner, Itzehoe (DE); Fabian Lofink, Itzehoe (DE); Bernhard Wagner, Itzehoe (DE); Holger Kapels, Itzehoe (DE)

(73) Assignee: Fraunhofer-Gesellschaft zur Förderung der angewandten Forschung e.V., Munich (DE)

( * ) Notice: Subject to any disclaimer, the term of this patent is extended or adjusted under 35 U.S.C. 154(b) by 418 days.

(21) Appl. No.: 18/455,136

(22) Filed: Aug. 24, 2023

(65) Prior Publication Data

US 2023/0395707 A1 Dec. 7, 2023

Related U.S. Application Data

(63) Continuation of application No. PCT/EP2022/054315, filed on Feb. 22, 2022.

(30) Foreign Application Priority Data

Feb. 25, 2021 (DE) ..................... 10 2021 201 789.4

(51) Int. Cl.
*H10D 30/47* (2025.01)
*H10D 62/40* (2025.01)
(Continued)

(52) U.S. Cl.
CPC ......... *H10D 30/475* (2025.01); *H10D 62/405* (2025.01); *H10D 62/8503* (2025.01); *H10D 62/852* (2025.01); *H10D 64/256* (2025.01)

(58) Field of Classification Search
CPC .. H10D 30/015; H10D 30/471; H10D 30/472; H10D 30/473; H10D 30/4732;
(Continued)

(56) References Cited

U.S. PATENT DOCUMENTS 9,871,112 B1 * 1/2018 Cheng ................ H10D 62/8503
10,636,881 B2 4/2020 Beam, III et al.
(Continued)

FOREIGN PATENT DOCUMENTS

JP 2013-074281 A 4/2013
JP 2021-027151 A 2/2021

OTHER PUBLICATIONS

O. Ambacher et al., "Two-dimensional electron gases induced by spontaneous and piezoelectric polarization charges in N- and Ga-face AlGaN/GaN heterostructures0," J. Appl. Phys., Mar. 15, 1999, pp. 3222-3233, vol. 85, No. 6.
(Continued)

*Primary Examiner* — Eric A. Ward
(74) *Attorney, Agent, or Firm* — Bridgeway IP Law Group, PLLC; Jihun Kim

(57) ABSTRACT

An electronic component comprises a first layer and a second layer, wherein a main surface of the first layer is arranged opposite a main surface of the second layer. The first layer comprises a polarized first material. A polarization of the first material faces in a first direction. The second layer comprises a polarized second material having at least one polarization state, wherein a direction of a polarization of the second material at least in the one polarization state of the second material is at least in part opposite to the first direction such that a charge zone forms along the main surface of the first and/or the second layer, said charge zone being electrically conductive at least when the second material is in the one polarization state.

28 Claims, 7 Drawing Sheets

(51) Int. Cl.

| | |
|---|---|
| ***H10D 62/85*** | (2025.01) |
| ***H10D 62/852*** | (2025.01) |
| ***H10D 64/23*** | (2025.01) |

(58) Field of Classification Search

CPC ........... H10D 30/4735; H10D 30/4738; H10D 30/474; H10D 30/475; H10D 30/4755; H10D 30/476; H10D 30/477; H10D 30/478

See application file for complete search history.

(56) References Cited

U.S. PATENT DOCUMENTS

| | | | | |
|---|---|---|---|---|
| 2008/0258135 | A1 | 10/2008 | Hoke et al. | |
| 2013/0082360 | A1 | 4/2013 | Miyajima et al. | |
| 2014/0266324 | A1 | 9/2014 | Teo et al. | |
| 2019/0346624 | A1 | 11/2019 | Soltani et al. | |
| 2020/0098871 | A1* | 3/2020 | Chen | H10D 30/47 |
| 2020/0411677 | A1* | 12/2020 | Then | H10D 84/856 |

OTHER PUBLICATIONS

K. Frei et al., "Investigation of growth parameters for ScAIN-barrier HEMT structures by plasma-assisted MBE", Jpn. J. Appl. Phys., 2019, p. SC1045, vol. 58.

S. Fichtner et al., "AlScN: A III-V Semiconductor Based Ferroelectric", https://arxiv.org/abs/1810.07968.

C. E. Dreyer et al., "Correct implementation of polarization constants in wurtzite materials and impact on III-nitrides", Phys. Rev. X, 2016, p. 021038, vol. 6, No. 2.

M. Caro et al., "Piezoelectric coefficients and spontaneous polarization of ScAIN.", J. Phys. Condensed Matter, May 22, 2015, p. 245901, vol. 27, No. 24.

F. Bernardini et al., "Spontaneous polarization and piezoelectric constants of III-V nitrides", Phys. Rev. B, Oct. 15, 1997, p. R10 024, vol. 56, No. 16.

L. Vegard et al., "Die Konstitution der Mischkristalle und die Raumfüllung der Atome", ["The makeup of mixed crystals and the space filling of the atoms"] Zeitschrift fur Phys. [Physics journal], 1921, vol. 5, p. 17—only available in German language.

M. Uehara et al., "Increase in the piezoelectric response of scandium-doped gallium nitride thin films sputtered using a metal interlayer for piezo MEMS", Appl. Phys. Lett., Jan. 4, 2019, vol. 114, No. 012902.

M. Uehara et al., "Giant increase in piezoelectric coefficient of AIN by Mg—Nb simultaneous addition and multiple chemical states of Nb", Appl. Phys. Lett., Sep. 11, 2017, vol. 111, No. 11, p. 112901.

Green Andrew J et al., "ScAlN/GaN High-Electron-Mobility Transistors With 2.4-A/ mm Current Density and 0.67-S/mm Transconductance", IEEE Electron Device Letters, IEEE, Jul. 2019, pp. 1056-1059, vol. 40, No. 7, USA.

Jena Debdeep et al., "The new nitrides: layered. ferroelectric. magnetic. metallic and superconducting nitrides to boost the GaN photonics and electronics eco-system", Japanese Journal of Applied Physics, IP, May 17, 2019, pp. SC0801-I-SC0801-8, vol. 58, No. SC, 17, ISSN: 0021-4922, XP055898084.

* cited by examiner

ELECTRONIC COMPONENT, METHOD FOR THE CONTROL THEREOF, AND METHOD FOR PRODUCING AN ELECTRONIC COMPONENT

CROSS-REFERENCES TO RELATED APPLICATIONS

This application is a continuation of copending International Application No. PCT/EP2022/054315, filed Feb. 22, 2022, which is incorporated herein by reference in its entirety, and additionally claims priority from German Application No. DE 10 2021 201 789.4, filed Feb. 25, 2021, which is incorporated herein by reference in its entirety.

Embodiments of the present invention relate to electronic components, for example semiconductor structures. Some embodiments relate to semiconductor heterostructures. Further embodiments relate to methods for producing electronic components, for example methods for producing semiconductor structures. Further embodiments relate to a method for controlling an electronic component.

Some examples relate to a semiconductor device having improved conductivity.

Some examples relate to a High Electron Mobility Transistor (HEMT), for example for use in convertors or in power amplifiers.

BACKGROUND OF THE INVENTION

The increase in the efficiency and the power density is one of the essential drivers for the developments of converters for DC/DC, DC/AC and AC/DC applications. In particular in the field of server farms, the needed cooling capacity is directly dependent on the conversion losses of the supply voltages at the PCB level. In the automotive field, the motor integration of power-electronic components increases the power density, with additionally increased demands on the heat dissipation and the long-term reliability. Therefore, in recent years, components based on wide-bandgap semiconductors, such as silicon carbide (SiC) or the group III nitrides (III-N) such as GaN, AlN and InN, and the tertiary compounds thereof, are becoming prevalent. These semiconductor components make use of the unipolar conductivity of the electrons, such that the switching losses can be significantly reduced compared with bipolar components, and thus fade into the background compared with the on-state losses. The roadmap of future components is therefore currently determined substantially by the minimum achievable area-specific resistance of the components. In the blocking voltage region around 600 V, at present, on the basis of GaN HEMT transistors, area-specific forward resistances of below 1 mOhm*$cm^2$ are achieved.

Extraordinarily high charge carrier densities in wide-bandgap semiconductor components are achieved by forming two-dimensional electron gases (2DEGs) at the boundary surface of polar group Ill nitrides [1]. The cause of the formation of the 2DEGs is a discontinuity of the polarization of two materials. The polarization, in turn, is due to the crystal structure of the materials used, and includes spontaneous and piezoelectric polarization. Studies [3]-[6] exist regarding the magnitude and the sign of some polar materials, for example materials having a wurtzite structure. The charge density of the 2DEGs produced by conventional approaches achieves values up to the order of magnitude of 10 $\mu C/cm^2$, which corresponds to an electron density of $6\times10^{13}/cm^2$ [2].

SUMMARY

An embodiment may have an electronic component, comprising a first layer and a second layer, wherein a main surface of the first layer is arranged opposite a main surface of the second layer, wherein the first layer comprises a polarized first material, and wherein a polarization of the first material faces in a first direction, and wherein the second layer comprises a polarized second material in one polarization state in which a direction of a polarization of the second material is at least in part opposite to the first direction so that a charge zone forms along the main surface of the first and/or the second layer, said charge zone being electrically conductive.

Another embodiment may have an electronic component, comprising a first layer and a second layer, wherein a main surface of the first layer is arranged opposite a main surface of the second layer, wherein the first layer comprises a first material with a wurtzite crystal structure, and wherein a polarization of the first material faces in a first direction, and wherein the second layer comprises a second material with a wurtzite crystal structure, wherein the second material comprises a transition metal, wherein the second material is ferroelectric and comprises at least one polarization state, wherein a direction of a polarization of the second material at least in the one polarization state of the second material is at least in part opposite to the first direction, so that a charge zone is formed along the main surface of the first and/or second layer, said charge zone being electrically conductive at least when the second material is in the one polarization state, and wherein the one polarization state of the second material is a first polarization state and wherein the direction of the polarization of the second material in a second polarization state of the second material is at least in part aligned with the first direction, and wherein the electronic component is configured to set the second material of the second layer to the first polarization state, at least in regions.

Another embodiment may have a method for controlling the electronic component according to the invention, wherein the method comprises: setting the second material, in at least one region of the second layer, to the one polarization state.

Another embodiment may have a method for producing an electronic component, comprising: arranging a first layer and a second layer, such that a main surface of the second layer is arranged opposite a main surface of the first layer, such that the first layer comprises a first material, and the second layer comprises a second material, wherein the second material comprises at least one polarization state, and such that a polarization of the first material faces in a first direction, such that the direction of the polarization of the second material at least in the one polarization state of the second material is at least in part opposite to the first direction so that a charge zone forms along the main surface of the first layer and/or the second layer, said charge zone being electrically conductive at least when the second material is in the one polarization state.

In view of the aims mentioned at the outset, an electronic component having high electrical conductivity would be desirable.

The inventors have found that a charge zone having a particularly high conductivity can form in a hetero-layer structure of an electronic component, along a boundary surface of the hetero-layer structure, if a first layer and a second layer of the hetero-layer structure are formed such that a polarization of a polar first material of the first layer at least in part opposes a polarization of a polar second material of the second layer.

One embodiment of the present invention provides an electronic component which comprises, for example, a semiconductor heterostructure, for example a hetero-layer structure. The electronic component contains a first layer and a second layer. A main surface, for example a main surface region, of the first layer is arranged opposite a main surface, for example a main surface region, of the second layer. The first layer contains a polarized first material, and the second layer contains a polarized second material, which can be distinguished from the first material, for example has a bandgap that is different from a bandgap of the first material. A polarized material is understood to mean, for example, an electrically polarized material, for example a material having a polar crystal structure. Examples of polarized materials include pyroelectric materials, which include ferroelectric materials. A polarization of the first material faces in a first direction. The second material has at least one polarization state, i.e. a polarized state, i.e. the second material can be in at least one polarized state, which is characterized for example by a polarization direction of the polarization of the second material. The one polarization state can be the single (e.g. a permanent state of the second material) or one of a plurality of polarization states of the second material. At least in the one second polarization state of the second material, which corresponds for example to a first of a plurality of possible polarization states, a direction of a polarization of the second material at least in part opposes the first direction, or is at least in part antiparallel with respect to the first direction. The second layer is configured, at least in the polarization state, in such a way that a charge zone forms along the main surface of the first and/or of the second layer, which is conductive at least when the second material is in the polarization state. The charge zone is for example a two-dimensional depletion region, for example a 2DEG, which can be located for example in the first layer, in the second layer, or between the first layer and the second layer.

Since both the first material and the second material are polarized, a charge zone can form along the main surface of the first and/or the second layer, said charge zone being limited in a direction perpendicular to the main surface, in the examples to a few nanometers. In such charge zones that are limited in one dimension, also referred to as 2DEG, the mobility of the charge carriers can also be very high, as a result of which high conductivity is achieved. On account of the small dimension of the charge zone in the direction perpendicular to the main surface of the first or second layer, the charge carrier density in the charge zone can furthermore be influenced very efficiently, for example by means of electrical fields. This offers the possibility of implementing transistors, for example for converters, in which very high currents can be switched with relatively small electrical fields.

In order to create the 2DEGs, hitherto layers have been deposited in such a way that the polarization of both layers faces in the same direction. On account of theoretical calculations, it has been possible to assume that this is the optimal configuration for these structures, and furthermore is also easier to produce than structures in which the polarization faces in opposite directions [1]. However, the inventors have found that higher charge carrier densities can be achieved if the polarization of the two materials in the two layers is opposing. In examples of the invention a charge carrier density that is increased 25-fold, in this manner, compared with the conventional technology, can be generated in the charge zone. As a result, for example the power loss of a HEMT based on such a heterostructure can be substantially reduced.

The inventors have found that this effect can be achieved in the case of a plurality of polarized materials, wherein the magnitude of the effect can be dependent on the magnitude of the polarization of the materials used. In other words, the effect of the increased charge carrier density can be expected for all heterostructures of two layers comprising polar materials, for example materials having a wurtzite structure, as long as a state of the two structures can be created in which the polarization of the two layers is oriented in an opposing manner. This state can be achieved, in examples, by a suitable deposition process. In further examples, this state can be achieved in that the polarization of one of the two layers is inverted, or at least changed in such a way that the polarization of said layer of the polarization is at least in part opposite to the others of these layers, by application of an electrical field.

In embodiments, the first material has a wurtzite crystal structure, and the second material has a wurtzite crystal structure. Materials having a wurtzite crystal structure are polar and are thus particularly well-suited for creating a polarization discontinuity between the first layer and the second layer, as a result of which the formation of a two-dimensional electron gas having a high charge carrier density can be achieved. Furthermore, these materials tend to have high bandgaps, as a result of which they are particularly well-suited for power-electronic components. Since both the first material and also the second material have a wurtzite crystal structure, a layer structure which contains the first and the second layer can be produced in manner particularly low in defects, which has a positive influence on the conductivity.

In embodiments, the charge carrier density in the charge zone is more than $10^{12}$ cm$^{-2}$ or more than $10^{13}$ cm$^{-2}$ or more than $6\times10^{13}$ cm$^{-2}$, when the first material is in the one polarization state.

A further embodiment of the present invention provides an electronic component which comprises, for example, a semiconductor heterostructure, for example a hetero-layer structure. The electronic component comprises a first layer and a second layer. A main surface, for example a main surface region, of the first layer is arranged opposite a main surface, for example a main surface region, of the second layer. The first layer comprises a first material having a wurtzite crystal structure. A polarization of the first material faces in a first direction. For example, the first direction is perpendicular to the main surface of the first and/or of the second layer. The second layer comprises a second material having a wurtzite crystal structure. For example, the second material is different from the first material, for example the second material has a bandgap that is different from the bandgap of the first material. The second material is ferroelectric. The direction of the polarization of the second material is at least in part opposite to the first direction at least in one polarization state, for example in a first polarization state of a plurality of possible polarization states, for example a predetermined polarization state. In examples, the second material is in the polarization state or can be set thereto, for example by means of an electrical field. The second material comprises a transition metal. For example, the second material consists of a compound of a plurality of materials, at least one of which is a transition metal.

Examples of the electronic component have the functions and advantages described in connection with the above embodiments.

Since materials having a wurtzite crystal structure are polar, a charge zone can form along the main surface of the first layer and/or of the second layer. Due to the polarization of the first material that is at least in part opposite in relation to the second material, a discontinuity of the polarization between the first layer and the second layer is particularly strongly developed, as a result of which a particularly high charge carrier density can form in this charge zone. Ferroelectric materials have the property that the orientation of their polarization can be changed by applying an electrical field, and the orientation of the polarization is maintained, even if it is no longer subjected to the electrical field. Changing the orientation of the polarization of the second material influences the development of the discontinuity of the polarization between the first and the second layer. Thus, in this way, the charge carrier density in the charge zone can be set. The use of a ferroelectric material can thus make it possible to control the conductivity of the charge zone by setting a polarization state. In addition, the changeability of the polarization direction of the second material can allow for a simple production process for an electronic component, in which the polarization directions of the first and second layer are at least in part opposite one another. For example, the first and the second layer can be produced by means of a method which results in an alignment of the polarizations of the first and second layer. In this way, retrospective changing of the polarization direction of the second layer, for example by means of an electrical field, makes it possible to achieve a high conductivity in the charge zone.

A field strength of a ferroelectric material needed for changing the polarization direction is also referred to as the coercivity. The inventors have found that a material that comprises a transition metal tends to have a lower coercivity than the corresponding material without a transition metal. In particular, the coercivity in materials comprising a transition metal can be below the breakdown field strength, such that these materials can be ferroelectric. For example, group III nitride compounds which contain a transition metal can, in contrast to their corresponding pure group III nitride compounds, be ferroelectric.

Advantageous examples of the above-described embodiments will be described in the following.

In examples, the charge carrier density in a charge zone along the first layer and/or the second layer, for example the charge zone of the above-described embodiments, is more than $10^{12}$ $cm^{-2}$ or more than $10^{13}$ $cm^{-2}$ or more than $6\times10^{13}$ $cm^{-2}$, when the first material is in the one polarization state. If the charge carrier density is more than $10^{12}$ $cm^{-2}$, then the charge zone is electrically conductive. If the charge carrier density is more than $6\times10^{13}$ $cm^{-2}$, then it has a particularly high conductivity, which is for example higher than in the solutions known from the conventional technology.

In examples, the first material is a nitrogen compound, which comprises at least one group III element. Alternatively or in addition, in this example the second material is a nitrogen compound, which comprises at least one group III element. Group III nitride compounds tend to have a high bandgap. Thus, semiconductor components, for example HEMTs, can be configured in a particularly low-loss manner by the use of group III nitride compounds.

In examples, the second material is a nitrogen compound that comprises one or more group III elements and furthermore comprises a transition metal. The inventors have found that a plurality of materials of the group III nitrogen compounds, which furthermore comprise a transition metal, are ferroelectric. Thus, the advantages of the use of a ferroelectric material can be combined with the advantages of a large bandgap.

In examples, a stoichiometric proportion of the transition metal in the nitrogen compound is between 10% and 50% of a total stoichiometric proportion of the one or more group III elements in the nitrogen compound of the second material. The inventors have found that such a proportion of the transition metal can ensure a particularly high polarization of the second material. Thus, a high charge carrier density can be achieved in a charge zone along the main surface of the first layer and/or of the second layer. The proportion of over 10% makes it possible to ensure that the second material is ferroelectric.

In examples, the first material is one of GaN, GaScN, AlScN, AlN, InGaN, InGaScN, AlGaN, AlGaScN. Alternatively or in addition, in this example the second material is one of AlscN, AlGaScN, GaScN, AlN, AlGaN, AlMgNbN, AlGaN, AlGaScN. These materials offer a particularly good combination of a high bandgap and a significant polarization.

In examples, the combination of the second material and the first material (second material/first material) is one of the following: AlScN/GaN, AlScN/GaScN, AlGaScN/GaN, GaScN/AlScN, GaScN/AlN, AlScN/InGaN, AlScN/InGaScN, AlMgNbN/GaN. These combinations are particularly well suited, on account of their ration of the bandgaps of the first material and of the second material, and the polarizations of the first material and of the second material (which may be dependent on the combination) for forming a high charge carrier density in the charge zone. Furthermore, these material combinations can be reliably produced by means of established production methods, at least such that the polarization directions of the first and the second material are the same. Optionally, the first material and the second material can be selected such that they have similar lattice constants. Thus, the production process for the electronic component can be particularly simple, and main surfaces of the first material and of the second material that have particularly few defects can be achieved, which can additionally have a positive effect on the conductivity in the charge zone.

In examples, the second material is ferroelectric such that a direction of a polarization of the second material can be changed. The one polarization state, i.e. the polarization state described above, in which the direction of the polarization of the second material is at least in part opposite the first direction is a first polarization state. In a second polarization state of the second material, the direction of the polarization of the second material is at least in part aligned with the first direction, for example is at least in part in parallel with the first direction. "At least in part aligned" is to be understood to mean that the polarization comprises a directional component which faces in the first direction. Since the charge carrier density in the charge zone along the main surface of the first layer and/or of the second layer is higher when the polarizations of the first and of the second layer are at least in part opposite to one another than when the polarizations of the first and of the second layer are at least in part aligned with one another, a change between the first polarization state and the second polarization state makes it possible to change the conductivity of the charge zone between a higher value and a lower value. This makes it possible to implement a switchable electronic component. Since the direction of the polarization of the second material can be changed, the electronic component can furthermore be implemented in such a way that the polarization of the second material in a first region faces in the first direction, and in a second region faces in the second direction, such that regions of different conductivity can be implemented. As a result, for example conduction channels can be defined. Furthermore, this example has the advantages described above with respect to a ferroelectric second material.

In examples, the charge carrier density in a (the) charge zone along the main surface of the first layer and/or the second layer is greater when the second material is in the first polarization state than when the second material is in the second polarization state. That is to say, for example, that the second material and/or the first material are configured in such a way that this effect arises. This can be achieved for example by means of the above-mentioned materials.

In examples, the electronic component further comprises a third layer which is arranged between the first layer and the second layer and has a wurtzite crystal structure. The third layer can change the position of the charge zone in such a way that this is arranged so as to be spaced apart from the second layer, for example in the first layer or at the main surface of the first layer (wherein the charge zone can also extend in the third layer). The first layer can have particularly few defects, since, in examples, it may have been produced epitaxially. In some examples, the third layer between the first layer and the second layer can reduce the number of surface defects at the main surface of the first layer and/or the second layer compared with an arrangement in which the first layer and the second layer directly adjoin one another. A higher conductivity is achieved thereby. Furthermore, the second layer makes it possible to compensate a difference in the lattice constants of the first layer and of the second layer. In examples, the polarization of the first and/or of the second layer can thus be increased.

In examples, the second layer has a thickness of less than 50 nm, or less than 30 nm, or less than 10 nm. A layer thickness of less than 50 nm makes it possible to achieve a change between the first polarization state and the second polarization state, using an electrical field of moderate strength. Furthermore, a layer thickness of less than 50 nm makes it possible to contact the charge zone by means of contacts, e.g. source and drain, which are arranged on a further main surface of the second layer that is opposite the main surface of the second layer. A simple implementation of the contacts is possible as a result. A layer thickness of less than 50 nm furthermore makes it possible to control the charge carrier density in the charge zone with relatively lower gate voltages of the gate electrode opposite the further main surface of the second layer.

In examples, the electronic component further comprises a source contact and a drain contact, wherein the charge zone is arranged in series, i.e. for example electrically in series, between the source contact and the drain contact. This makes it possible to use the charge zone as a conduction channel.

In examples, the electronic component further comprises a gate electrode. The gate electrode is arranged such that the second layer is arranged between the first layer and the gate electrode. Applying an electrical voltage to the gate electrode makes it possible to control the charge carrier density, and thus the conductivity, of the charge zone.

In examples, the gate electrode is arranged opposite the second layer only in regions, for example in regions with respect to the lateral extension of the gate electrode. In this case, a lateral direction can be understood to mean a direction along, e.g. in parallel with, the second layer. This makes it possible to achieve charge carrier densities in the charge zone that are different in regions or locally.

In examples, the electronic component further comprises an electrically insulating layer which is arranged between the gate electrode and the second layer. Thus, entry of charge carriers from the gate electrode into the second layer can be prevented, as a result of which leakage currents between the gate electrode and the charge zone can be prevented. In addition or alternatively, an oxidation of the second layer can be prevented by said layer.

In examples, the second material is ferroelectric, such that a direction of a polarization of the second material can be changed, wherein the one polarization state of the second material is a first polarization state. In a second polarization state of the second material, the direction of the polarization of the second material is at least in part aligned with the first direction. The gate electrode is configured to set the second material to the first polarization state, at least in a region of the second layer opposite the gate electrode, by applying a first voltage, of a first polarity, to the gate electrode. Furthermore, the gate electrode is configured to set the second material to the second polarization state, at least in the region of the second layer opposite the gate electrode, by applying a second voltage, having a second polarity, to the gate electrode. “Setting” can be understood to mean, for example, that the set polarization state, for example the first or second polarization state, is maintained if no voltage is any longer applied to the gate electrode following setting of the polarization state. The application of the voltage to the gate electrode can take place for example by applying a voltage between the gate electrode and the first layer, or by applying a voltage between the gate electrode and the charge zone, for example via a source contact or a drain contact. The gate electrode thus makes it possible to change the polarization state of the second material, and thus to set the charge carrier density in the region of the charge zone opposite the gate electrode. For example, the conductivity of a conduction channel between the source contact and the drain contact can be set by means of the gate electrode.

In examples, the second material is configured to maintain, i.e. for example at least substantially maintain, a most recently set polarization state, for example the first polarization state or the second polarization state, in a state of the electronic component in which no voltage is applied to the gate electrode. “Maintaining the polarization state” means, for example, that a polarization direction that is at least in part opposite to the first direction remains at least in part opposite to the first direction, and a polarization direction that is at least in part aligned with the first direction remains at least in part aligned. This can also be achieved by means of the second material being ferroelectric. Maintaining the polarization state without a gate voltage being applied allows for energy-efficient operation, in which for example leakage currents are prevented.

In examples, the direction of the polarization of the first material is oriented in such a way that the second polarity of the second voltage is a negative polarity. Thus, application of a voltage of the second polarity can bring about a field effect which leads to a reduction in an electron density in the charge zone.

A further embodiment of the invention provides a method for controlling the electronic component, wherein the method comprises setting the second material (121), in at least one region of the second layer (120), to the one polarization state. As a result, a high conductivity in the charge zone can be achieved, as described with respect to the electronic component. In particular, this offers advantages in cases in which the polarization of the first and second material are aligned following production.

A further embodiment of the invention provides a method for producing an electronic component, for example a component according to any of the preceding embodiments. The method includes arranging a first layer and a second layer in such a way that a main surface of the second layer is arranged opposite a main surface of the first layer. The first layer comprises a first material, and the second layer comprises a second material. The second material has at least one polarization state. The arrangement is carried out such that a polarization of the first material faces in a first direction. The arrangement is furthermore carried out such that a direction of the polarization of the second material at least in the one polarization state, for example a predetermined polarization state, of the second material is at least in part opposite to the first direction such that a charge zone forms along the main surface of the first layer and/or of the second layer, said charge zone being electrically conductive at least when the second material is in the polarization state.

In examples, the arrangement of the first layer and of the second layer is carried out such that the second material is in the one polarization state, after the arrangement of the first layer and of the second layer.

In examples, the second material is ferroelectric, such that a direction of a polarization of the second material can be changed, wherein the one polarization state of the second material is a first polarization state. In a second polarization state of the second material, the direction of the polarization of the second material is at least in part aligned with the first direction. Furthermore, the method comprises a step of applying an electrical field to the second material in a direction that is at least in part perpendicular to the main surface of the first or second layer in order to set the second material to the first polarization state, at least in regions. This example offers the advantage that known methods can be used for arranging the first layer and the second layer, which methods are relatively simple to implement and by means of which the first layer and the second layer can be arranged in such a way that the main surfaces of the first and the second layers have a small number of surface defects.

In examples, the method further comprises arranging a gate electrode, at least in regions, such that the second layer is arranged between the first layer and the gate electrode. Furthermore, the application of the electrical field to the second material is carried out by applying a voltage to the gate electrode.

In examples, the method further includes at least partly removing the gate electrode after the second material has been set to the first polarization state at least in regions. At least partly removing the gate electrode makes it possible for the gate electrode to be used for applying a voltage, in order to set the polarization state of the second material in a region opposite a remaining part of the gate electrode, while a region of the second material opposite the removed part of the gate electrode remains in the first polarization state. Thus, the charge carrier density in the charge zone can be set in regions. Furthermore, it is thus possible to ensure that the gate electrode is arranged in a manner electrically insulated from the source contact and the drain contact. Likewise, a low capacity of the gate electrode can be achieved.

In examples, the gate electrode is removed only in part, and the voltage for setting the first polarization state is a first voltage. Furthermore, the method includes applying a second voltage to the gate electrode, after the partial removal of the gate electrode, in order to set the second material to the second polarization state at least in regions, for example in a region opposite a part of the gate electrode that remains after the partial removal of the gate electrode. It is thus possible to generate locally different charge carrier densities in the charge zone.

BRIEF DESCRIPTION OF THE DRAWINGS

Embodiments of the present invention will be detailed subsequently referring to the appended drawings, in which.

DETAILED DESCRIPTION OF THE INVENTION

In the following, examples of the present disclosure are described in detail, with reference to the accompanying descriptions. In the following description, a number of details are described in order to provide a more thorough explanation of examples of the disclosure. However, it is obvious to persons skilled in the art that other examples without these specific details can be implemented. Features of the different examples described can be combined with one another, unless features of a corresponding combination are mutually exclusive or such a combination is explicitly excluded.

It is noted that identical or similar elements, or elements which have the same function, may be provided with the same or similar reference signs or have the same designation, wherein a repeated description of elements that are provided with the same or similar reference signs or have the same designation is typically omitted. Descriptions of elements which have the same or similar reference signs or have the same designation are mutually interchangeable.

Figure 1:
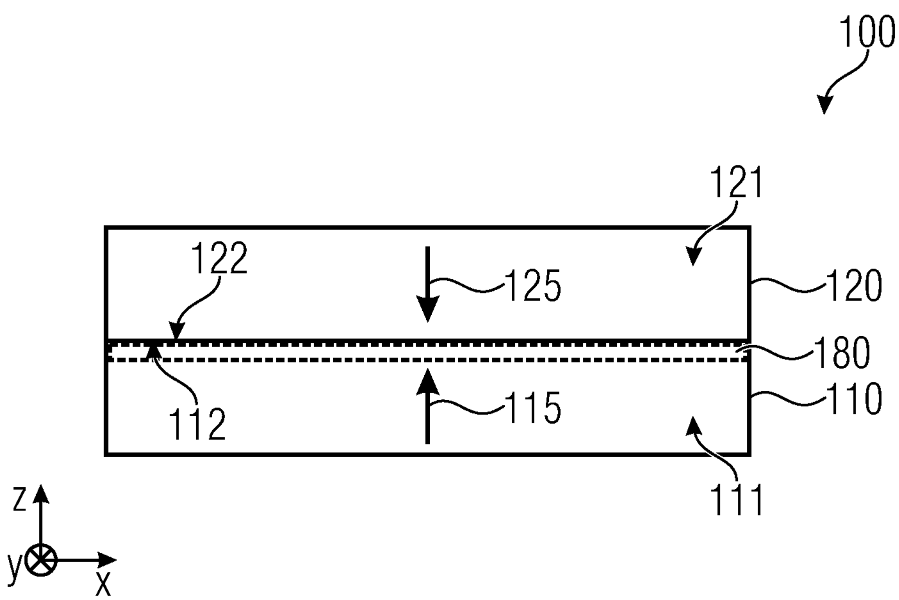
FIG. 1 is a schematic view of an electronic component according to one embodiment.

FIG. 1 is a schematic view of an electronic component 100 according to one embodiment. The electronic component 100 comprises a first layer 110 having a main surface 112. Furthermore, the electronic component 100 contains a second layer 120 having a main surface 122. The main surface 120 of the second layer 120 is arranged opposite the main surface 112 of the first layer 110. In examples, as shown by way of example in FIG. 1, the main surface 122 is arranged adjoining the main surface 112. In other examples, the main surface 122 is spaced apart from the main surface 112. The first layer 110 comprises a polarized first material 111. A polarization 115 of the first material 111, illustrated in FIG. 1 by means of an arrow 115, faces in a first direction. In FIG. 1, the first direction is selected, by way of example, such that it faces in the direction of the second layer 120; in other examples the polarization 115 of the first material 111 faces in another direction, for example opposite to the direction shown in FIG. 1. The second layer comprises a polarized second material 121. The second material 121 has at least one polarization state. An example of said one polarization state is shown in FIG. 1. At least in the one polarization state of the second material 121, a direction of a polarization 125 of the second material 121, also referred to in the following as the polarization direction 125, is at least in part opposite to the polarization 115 of the first material 121. The first layer 110 and the second layer 120 are configured such that a charge zone 180 forms along the main surface 112 and/or along the main surface 122. The charge zone 180 is conductive at least when the second material 121 is in the one polarization state.

In examples, the second material 121 has just one polarization state, and the second material 121 is in this state. In other examples, e.g. if the second material is ferroelectric, the second material 121 has at least one first polarization state and one second polarization state, wherein the one polarization state, which is shown in FIG. 1, can correspond to the first polarization state.

As is shown by way of example in FIG. 1, the polarization 115 and the polarization 125 are perpendicular to the first main surface 112 and/or to the second main surface 122. In other examples, the polarization 115 and/or the polarization 125 are not perpendicular to the first main surface 112 and/or to the second main surface 122. The direction of the polarization 115 can correspond, for example, to a polar direction of the first material 111, and the direction of the polarization 125 can accordingly correspond to a polar direction of the second material 121. Advantageously, the first material 111 is arranged such that the direction of the polarization 115, also referred to in the following as the polarization direction 115, has at least one non-vanishing component perpendicular to the main surface 112. Likewise, the material 121 is advantageously arranged such that the polarization direction 125 has at least one non-vanishing component perpendicular to the main surface 122.

In examples, the first layer 110 and the second layer 120 are part of a layer structure. Each of the layers of the layer structure can comprise a main surface and a further main surface opposite the main surface. The main surfaces of the layers can be arranged in parallel, along a main direction of the layer structure. FIG. 1 shows a cartesian coordinate system, selected by way of example, according to which the first layer 110 and the second layer 120 are arranged along the z-direction. The first layer 110 and the second layer 120 may be arranged in parallel with the x-y plane.

The charge zone 180 is shown in FIG. 1, by way of example, inside the first layer 110. In other examples, the charge zone 180 is formed along the main surface 122, in the second layer 120. In further examples in which the main surface 112 is spaced apart from the main surface 142, the charge zone 180 can be arranged between the first layer 110 and the second layer 120. The extension of the charge zone 180 in the z-direction can be very small in examples, for example less than 10 nm or less than a few nanometers.

In examples, both the first material 111 has a wurtzite crystal structure, and the second material 121 has a wurtzite crystal structure. The wurtzite crystal structure can be polar. In examples, a polar axis of the first material 111 can be arranged in parallel with a polar axis of the second material 121.

Figure 2:
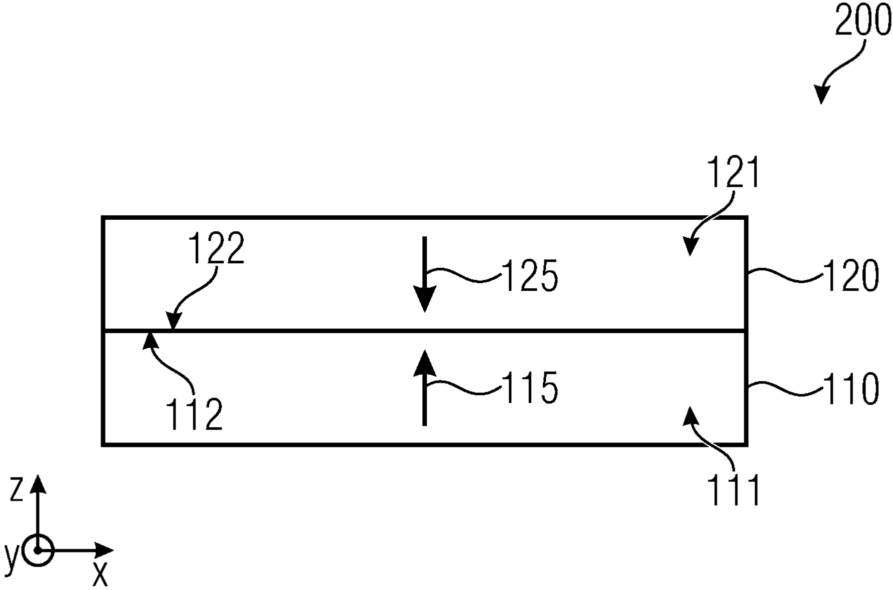
FIG. 2 is a schematic view of an electronic component according to a further embodiment.

FIG. 2 is a schematic view of an electronic component 200 according to a further embodiment. The electronic component 200 comprises a first layer 110 having a main surface 112 (also referred to as first main surface 112), and further comprises a second layer 120 having a main surface 122 (also referred to as second main surface 122). The main surface 122 is arranged opposite the main surface 112. The first layer 110 contains a first material 111 having a wurtzite crystal structure. A polarization 115 of the first material 111 faces in a first direction—the polarization direction 115 of the first material 111. The second layer 120 contains a second material 121 having a wurtzite crystal structure. The second material 121 is ferroelectric and has at least one polarization state, which is shown in FIG. 2. In examples, the second material 121 has at least two polarization states. At least in the one polarization state of the second material 121 shown in FIG. 2, a direction of a polarization 125 of the second material 121—the polarization direction 125 of the second material 121—is at least in part opposite to the polarization direction 115 of the first material 111. In the electronic component 200, the second material 121 contains a transition metal.

In examples, at least in the one polarization state a charge zone forms along the first main surface 112 and/or the second main surface 122, for example a charge zone according to the charge zone 180 from FIG. 1.

The description of the electronic component 100 and the description of the arrangement of the first layer 110, the second layer 120, the polarization direction 115, the polarization direction 125, and the x, y, z-directions, the first material 111, the second material 121, and the main surfaces 112, 122 in relation to the electronic component 100 can apply, in an equivalent manner, to the electronic component 200. In other words, the features described in the following with reference to the features of the electronic component 100 of FIG. 1 can optionally relate both to the electronic component 100 from FIG. 1 and to the electronic component 200 from FIG. 2.

On account of the polarization of the first material 111 and of the second material 121, the electrical potential at the first main surface 112 can deviate from the electrical potential in the interior of the first layer 110, and/or the electrical potential at the second main surface 122 can deviate from the electrical potential in the interior of the second layer 120. As a result, the charge zone 180 can form, which constitutes for example a 2DEG. In other examples, the charge zone 180 can constitute a two-dimensional hole gas.

For example, the result is the charge carrier density a of a 2DEG, or generally of the charge zone 180, which forms at a boundary surface between the first layer 110 and the second layer 120, for example the main surface 112 or the main surface 122, in the one polarization state in which the first polarization direction 115 is at least in part opposite to the second polarization direction 125 based on the sum of the polarizations of the first material 111 and the second material 121. In this case, the polarization of one of the materials can include spontaneous polarization and/or piezoelectric polarization and/or formal polarization.

On account of the charge carrier density in the charge zone, e.g. in the 2DEG, which is increased many times over by the in part opposing polarization directions, component surfaces that are smaller by more than a factor of 10, or optionally a power loss that is more than 10 times lower, can be achieved with the electronic component 100, 200. Furthermore, smaller component capacities and higher cutoff frequencies are made possible, on account of smaller component surfaces and higher gradients. As a result, the electronic component 100, 200 is particularly well-suited for transistors, e.g. HEMTs, such as for 6G+ applications, as well as for applications as a compact converter for SMPS and IT (telecom, computing, storage), military (base stations, RF energy), consumer goods, EV/HEV.

For example, a charge carrier density in the charge zone 180 is more than $10^{12}$ $cm^{-2}$ or more than $10^{13}$ $cm^{-2}$ or more than $6\times10^{13}$ $cm^{-2}$, when the first material is in the polarization state. In addition, in examples, the charge carrier density in the charge zone 180 can be less than $800\times10^{12}$ $cm^{-2}$ or less than $400\times10^{13}$ $cm^{-2}$, when the first material is in the polarization state. In the example, the charge carrier density is $134\times10^{13}$ $cm^{-2}$.

In embodiments, the charge carrier density in the charge zone 180, when the first material is in the polarization state, is between $10^{13}$ $cm^{-2}$ and $800\times10^{13}$ $cm^{-2}$, or between $6\times10^{13}$ $cm^{-2}$ and $800\times10^{13}$ $cm^{-2}$, or between $10\times10^{13}$ $cm^{-2}$ and $800\times10^{13}$ $cm^{-2}$, or between $50\times10^{13}$ $cm^{-2}$ and $400\times10^{13}$ $cm^{-2}$.

A high charge carrier density can bring about high conductivity of the charge zone 180. In examples comprising GaN as the first material 121, the theoretical limit for the conductivity of a 2DEG in the GaN can be below 0.1 mOhm*$cm^2$, or, at a voltage of 600 V, below 0.03 mOhm*$cm^2$.

In examples, the first material 111 is a nitrogen compound, which comprises at least one group III element. A nitrogen compound of this kind is referred to in the following as group III nitride compound. Alternatively or in addition, the second material 121 is a group III nitride compound.

In examples, the second material 121 is a nitrogen compound that comprises one or more group III elements and furthermore comprises a transition metal.

In examples, a stoichiometric proportion of the transition metal in the nitrogen compound of the second material 121 is between 10% and 50% of a total stoichiometric proportion of the one or more group III elements and the transition metal in the nitrogen compound. For example, the second material has the chemical formula $A_{(1-x)}T_xN$, where A represents a group III element or a plurality of different group III elements, T represents a transition metal, N is nitrogen, and x is between 0.1 and 0.5.

For example, the second material 121 is one of AlscN, AlGaScN, GaScN, AlN, AlGaN, AlMgNbN, AlGaN, AlGaScN. Additionally or alternatively, in examples, the first material 111 is one of GaN, GaScN, AlScN, AlN, InGaN, InGaScN, AlGaN, AlGaScN.

In examples, the combination of the second material 121 and the first material 111 is one of AlScN/GaN, AlScN/GaScN, AlGaScN/GaN, GaScN/AlScN, GaScN/AlN, AlScN/InGaN, AlScN/InGaScN, AlMgNbN/GaN.

In examples, the first material 111 is GaN and the second material 121 is AlScN. Aluminum scandium nitride and gallium nitride exhibit high spontaneous polarization. Furthermore, the lattice constant of AlScN can be similar to that of GaN or GaScN, such that the piezoelectric polarization can be disregarded in examples, such that this at least does not reduce the overall polarization of AlScN, when this is arranged adjacently to GaN (or is separated therefrom by a third layer). Thus, a high charge carrier density and low defect density results for this material combination.

In examples, the first material 111 is GaN and the second material 121 is $Al_{(1-x)}Sc_xN$, where x=0.18. In the case of this scandium portion, the lattice constant of the second material 121 is at least approximately the same as the lattice constant of the first material 111. On account of the high spontaneous polarization of AlScN and GaN, a high charge carrier density for a 2DEG in the charge zone 180 thus results.

In other words, without knowledge of the piezoelectric polarization, it is in general not possible, from the spontaneous polarization alone, to conclude the charge density of a 2DEG formed at the boundary surface between two different layers having a wurtzite structure. However, the inventors have found that the combination of a layer of the material AlScN with 18% ScN on a GaN layer constitutes an exception. Since the lattice constant a of the two materials is identical [7], no piezoelectric polarization occurs at a boundary surface between the two layers. Furthermore, the spontaneous polarization of the two materials is either known approximately from experimental data, or from correct theoretical calculations [3], [4]. Thus, for the charge carrier density σ of a 2DEG formed at the boundary surface between an 18% AlScN layer, on a GaN layer, it is the case, when both are deposited on the substrate according to conventional arrangements, having a positive polarization, i.e. for example having aligned polarization directions, that approximately the following applies:

$$\sigma = P_{GaN}^{spont} - P_{AlScN}^{spont} = 131\frac{\mu C}{cm^2} - 120\frac{\mu C}{cm^2} = 11\frac{\mu C}{cm^2} \quad \text{Eq. 1}$$

The order of magnitude of the charge carrier density thus achieved corresponds to the conventional technology. In contrast, for the orientation according to the invention of the first polarization direction 115 and the second polarization direction 125 in the one polarization state, as shown for example in FIG. 1, the following value results:

$$\sigma = P_{GaN}^{spont} + P_{AlScN}^{spont} = 131\frac{\mu C}{cm^2} + 120\frac{\mu C}{cm^2} = 251\frac{\mu C}{cm^2} \quad \text{Eq. 2}$$

The charge carrier density of the 2DEG thus created is therefore increased by 25 times compared with the conventional technology.

Such a consideration does not only apply to 18% AlScN on GaN. In other examples, the material combinations of the first layer 110 and the second layer 120 is one of a plurality of other possible material combinations, for example one of those mentioned above. In this case, the charge carrier density can be greater or smaller than the value calculated in Equation 2. For example, the polarization in compounds such as GaScN and AlScN becomes smaller as the Sc content increases, such that the sum in equation two would also become smaller, but larger than the polarization of the first layer, e.g. GaN, when the polarization is completely inverted. In examples, the polarization inversion can also take place incompletely, such that any charge carrier densities between the conventional technology of approximately 10 μC/$cm^2$ up to above the value given in Equation 2 can be achieved, e.g. by using pure AlN, which has a greater polarization than 18% AlScN. In examples, the constancy of the material properties of group III-N [4], [8] can be used, in order to select further material combinations for the first material 111 and/or the second material 121, proceeding from 18% AlScN.

In examples of the component 100 from FIG. 1, the second material 121, as in the case of the component from FIG. 2, is ferroelectric, such that the direction of the polarization 125 of the second material 121 can be changed. The one polarization state, in which the polarization of the second material 121 has for example the polarization direction 125 shown in FIG. 1, in these examples a first polarization state and in a second polarization state of the second material 121 the direction of the polarization of the second material 121 is at least in part aligned with the first direction.

In some examples, the polarization of the second material 121 in the second polarization state can be parallel to the first polarization direction 125.

As the inventors have recently discovered, materials having a wurtzite structure can also be ferroelectric. A ferroelectric material can assume a plurality of polarization states, in which the polarization of the material can face in different directions. A ferroelectric material can for example be set to one of its polarization states, in that the material is exposed to an electrical field that at least partly points in the direction of the polarization to be set. A change in the crystal lattice can occur in this case. For example, a material of a group III nitride compound can have a metal-polar orientation having one polarization direction, in one polarization state, and in a further polarization state can have a nitrogen-polar orientation having another, for example opposing, polarization direction.

The effect described here with respect to ferroelectric materials can, in examples, also be achieved by heterostructures formed of other materials which have a different structure from the wurtzite structure, in general by polar or polarized materials.

In examples, the charge carrier density in the charge zone 180 along the main surface of the first layer and/or the second layer is greater when the second material 121 is in the first polarization state than when the second material 121 is in the second polarization state.

In examples, the second layer has a thickness of less than 50 nm, or less than 30 nm, or less than 10 nm.

Figure 3:
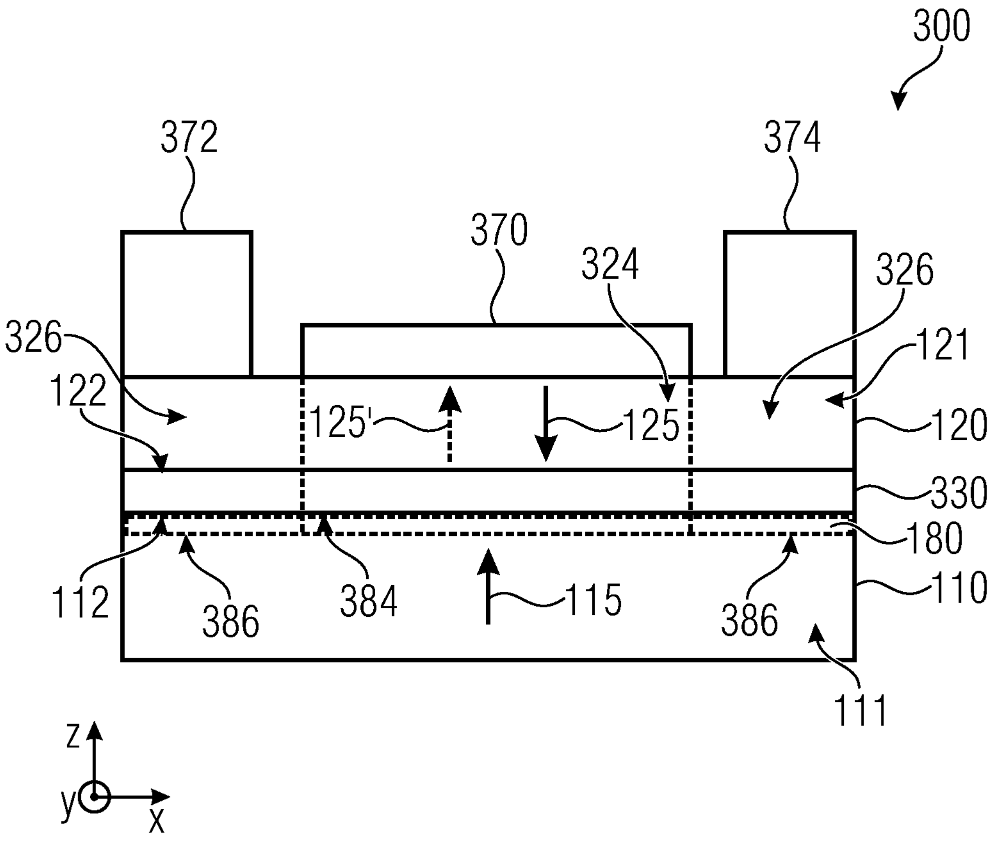
FIG. 3 is a schematic view of an embodiment of the electronic component as a transistor.

FIG. 3 is a schematic view of an electronic component 300 according to a further embodiment. The electronic component 300 is based on one of the electronic components 100, 200. For example, the electronic component 300 can correspond to one of the electronic components 100, 200.

For example, the electronic component 300 comprises a third layer 330. The third layer 330 is arranged between the first layer 110 and the second layer 120. For example, the third layer 330 can be arranged adjacently to the main surface 112 of the first layer 110 and adjacently to the main surface 122 of the second layer 120.

In examples, a lattice constant of a material of the third layer 330 can be similar to the lattice constant of the first material 110, such that particularly few surface defects form at the main surface 112 of the first layer 110. FIG. 3 shows, by way of example, an arrangement of the charge zone 180 in the first layer 110 and along the main surface 112. By the arrangement of the third layer 330, the charge zone 180 is spaced apart from the second layer 120. Therefore, on account of the third layer 330, it is possible to achieve an arrangement of the charge zone 180 on a boundary surface low in defects, even in cases in which the lattice constants of the first material 111 and of the second material 121 differ. As a result, a high conductivity in the charge zone 180 can be achieved.

In examples, the electronic component 300 further comprises a source contact 372 and a drain contact 374. The charge zone 180 is arranged in series between the source contact 172 and the drain contact 374.

Thus, the charge zone 180 can, in an electrically conductive state of the charge zone 180, such as in the one or the first polarization state of the second material 121, constitute an electrical connection between the source contact 372 and the drain contact 374. The electronic component 100, 200 can for example form a transistor or a part of a transistor, e.g. a HEMT. In examples, the source contact 372 can be provided by a source region of the electronic component. In examples, the drain contact 372 can be provided by a drain region of the electronic component.

For example, the source contact 372 and the drain contact 174 can be arranged adjoining a main surface of the second layer 120 opposite the main surface 142 of the second layer 120, as shown in FIG. 3. In other words, the source contact 372 and the drain contact 374 can be arranged above the second layer 120 in the z-direction. Such an arrangement of the source contact 372 and the drain contact 374 can be advantageous in particular in combination with the second layer 120 having a thickness of less than 50 nm or 30 nm of 10 nm. An arrangement of the source contact 372 and the drain contact 374 above the second layer 120 allows for simple implementation. A small thickness nonetheless makes it possible to ensure electrical contact between the source contact 372 or the drain contact 374 and the charge zone 180. For example, the second layer 120 can, however, also be purposely formed so as to be thinner in regions adjoining the source contact 372 and/or the drain contact 374 (thinner than in a region between the source contact and the drain contact), in order to allow good electrical contact with the charge zone 180. In examples, the third layer can be completely removed in the regions adjoining the source contact 372 and/or the drain contact 374.

In examples, the electronic component 300 further comprises a gate electrode 370, the second layer 120 being arranged between the first layer 120 and the gate electrode 370. For example, the gate electrode 370 is implemented by an electrically conductive layer, which is electrically contacted.

By applying an electrical voltage between the gate electrode 370 and the first layer 110, the second layer 120 can be subjected to an electrical field. For example, the voltage can be applied between the gate electrode 370 and a contact on the first layer 120. Alternatively, the voltage can be applied between the gate electrode 370 and the source contact 372 or the drain contact 374, such that the electrical field forms between the gate electrode and the charge zone 180. In this case, the direction of the electrical field can be dependent on the polarity of the applied voltage. A polarity of the material 121 of the second layer 120, in particular if this is ferroelectric, can align itself according to the applied electrical field. Thus, the gate electrode 370 makes it possible to set the material 121 to the first polarization state by applying a first voltage having a first polarity, and to set the material 121 to the second polarization state by applying a second voltage having a second polarity. FIG. 3 shows an example of the polarization direction 125 of the one or the first polarization state of the second material 121. Furthermore, an example of a direction the polarization 125', also referred to in the following as the polarization direction 125', in the second polarization state of the second material 121 is shown. According to the coordinate system shown by way of example in FIG. 3, a z-component of the polarization direction can be opposite a z-component of the polarization direction of the second polarization state 125'.

The gate electrode 370 can be arranged opposite a region 324 of the first layer 121, such that the region 324 and the gate electrode 370 have the same lateral extension, e.g. are congruent.

The gate electrode 370 can be spaced apart both from the source contact 372 and from the drain contact 374. That is to say that the gate electrode can be arranged so as to extend over a portion of a region arranged between the source contact 372 and the drain contact 374.

By applying a voltage between the gate electrode 370 and the charge zone 180, which can be contacted by the source contact 372 or the drain contact 374 for example, a field effect can furthermore be generated on the charge zone 180. In this case, a voltage between the gate electrode 370 and charge zone 180, at which the charge zone changes between a conductive and an insulating state on account of the field effect, can be referred to as the threshold voltage.

In examples, the second material 121 is ferroelectric, such that the direction of the polarization of the second material 121 can be changed. In these examples, the one polarization state, for example the polarization state having the polarization direction 125, is a first polarization state of the second material 121. In a second polarization state of the second material 121, the direction of the polarization of the second material 121 is at least in part aligned with the first direction, i.e. with the polarization direction 115 of the first material 111. The gate electrode 370 can be configured to set the second material 121 to the first polarization state, at least in a region 324 of the second layer opposite the gate electrode 370, by applying a first voltage having a first polarity to the gate electrode 370. Furthermore, the gate electrode 370 can be configured to set the second material 121 to the second polarization state, at least in the region 324 of the second layer opposite the gate electrode, by applying a second voltage, having a second polarity, to the gate electrode 370.

In examples, the first and second voltages (taking into account the sign, i.e. the polarity), which are needed for setting the second material to the first and the second polarization state, respectively, are greater than the threshold voltage. It is thus possible to ensure that the polarization state of the second material can be set to the first and the second polarization state, without impoverishing the charge zone by a field effect and thus making it more difficult to apply an electrical field to the second material.

Setting the polarization state makes it possible for the conductivity of the charge zone 180 in a region 384 of the charge zone 180, which is opposite the region 324 of the second layer, to be changed. In examples in which the region 324 covers only a portion of a lateral region between the source contact 372 and the drain contact 374, the conductivity of the charge zone 180 can thus be changed in a laterally limited manner, i.e. locally. The selection of the size of the region 324 covered by the gate electrode 370 thus makes it possible to set the extent to which the conductivity between the source contact 372 and the drain contact 374, over the charge zone 180, changes in the case of a change between the first polarization state and the second polarization state.

Accordingly, in examples, the gate electrode 370 is arranged opposite the second layer 120 only in regions, for example in regions with respect to the lateral extension.

For example, the second material 121 can be in the first polarization state or in the second polarization state, in a region 326 of the second layer 120 which is located outside of the region 324. In examples, the second material 121 can be in the first polarization state or in the second polarization state, in the region 326, and in further examples in the second polarization state. If the second material 121 is in the first polarization state in the region 326, a conductivity of a region 386 of the charge zone 180, which is opposite the further region 326 of the second layer 120, can be higher than when the second material 121 is in the second polarization state, in the further region 326.

In other words, a conductive layer, e.g. the gate electrode 370, can also be configured such that it does not cover the entire surface of the semiconductor structure, but rather only parts thereof. Accordingly, the charge carrier density can thus be determined locally in a wide interval, and can differ from the charge carrier density in other regions.

In other examples, the region 324 can extend in the lateral direction, i.e. with respect to the x-direction and/or y-direction in FIG. 3, from the source contact 372 to the drain contact 374, wherein the gate electrode 370 is electrically insulated from the source contact 372 and the drain contact 374. In examples, at least 80% of the lateral region between the source contact 372 and the drain contact 374 is covered by the gate electrode 370.

If the second material 121 is ferroelectric, then the second material 121 can remain in the set polarization state even if no more voltage is applied to the gate electrode 370. In other words, the setting of the polarization direction 125, 125' can take place by temporarily applying a voltage, which can be turned off when the polarization state is set.

Accordingly, the second material 121 can be configured to maintain a most recently set polarization state, for example the first or the second polarization state, in a state of the electronic component in which no voltage is applied to the gate electrode 370.

If no voltage is applied to the gate electrode 370, the charge zone 180 can thus have a higher conductivity when the second material 121 is in the first polarization state than when the second material 121 is in the second polarization state.

The polarization direction 115 of the first material 111 of FIG. 1-3 is to be understood as being by way of example. In other examples, a z-component of the polarization direction 115 faces in the direction opposite to the direction shown. Accordingly, in these other examples, a z-component of the polarization direction 125, 125' also faces in the direction opposite to the direction shown.

In examples, the first material 111 and the second material 121 are selected such that the electrical conductivity of the charge zone 180 is ensured by electrons. In other examples, the first material 111 and the second material 121 are selected such that the electrical conductivity of the charge zone 180 is ensured by holes. Applying an electrical voltage between the gate electrode 370 and the first layer 110, or between the gate electrode 370 and the charge zone 180, makes it possible to bring about a field effect which can increase or decrease the charge carrier density in the charge zone 180, depending on the polarity of the voltage and the type of charge carriers in the charge zone.

In examples, the direction of the polarization of the first material is oriented in such a way that the second polarity of the second voltage, by means of which the second material 121 can be set to the second polarization state, is a negative polarity. This is advantageous if the majority charge carriers in the charge zone 180 are electrons. Thus, applying the second voltage brings about an effect which contributes to a reduction in the electron density, and thus in the conductivity of the charge zone. In these examples, the threshold voltage can be negative, at least when the second material is in the first polarization state. In further of these examples, the threshold voltage is negative when the second material is in the first or second polarization state.

Although the features of the gate electrode 370, the source contact 372 and the drain contact 374, and the third layer 330 in FIG. 3 are explained in combination on the basis of one embodiment, these features can be implemented independently of one another. In particular, the third layer 330 can also be implemented without the gate electrode 370, the source contact 372 and the drain contact 374, for example in the electronic component 100, 200. An alternative embodiment of the source contact 372 and the drain contact 374, which can also be combined with the embodiment shown in FIG. 3, is shown in FIG. 4.

Figure 4:
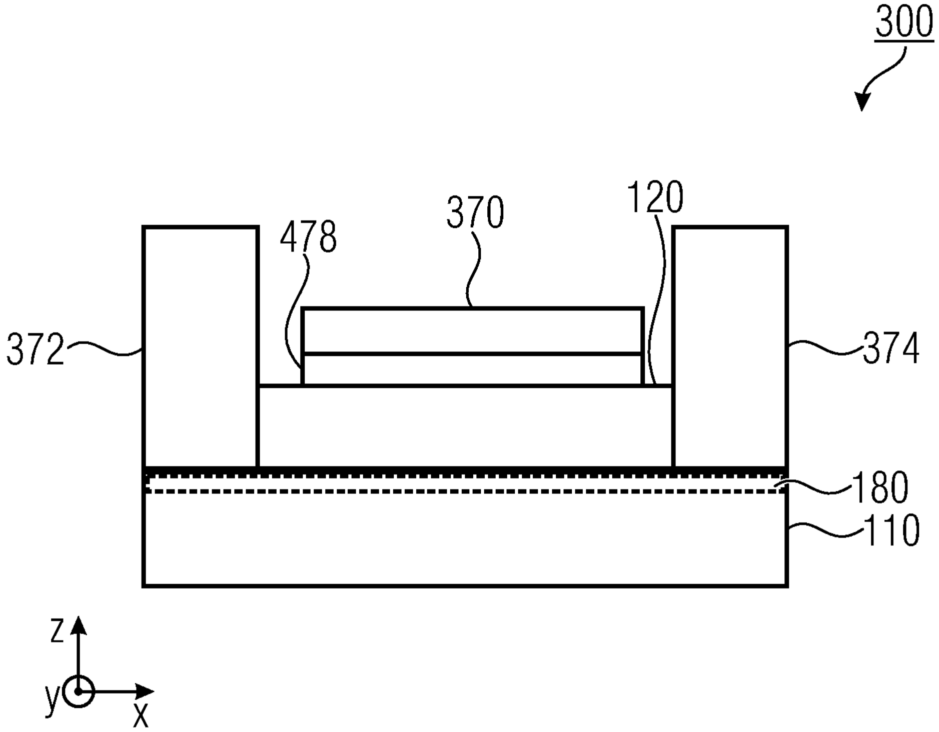
FIG. 4 is a schematic view of an embodiment of the electronic component as a transistor.

FIG. 4 is a schematic view of an alternative embodiment of the electronic component 300. In this example, the source contact 372 and the drain contact 374 are arranged adjoining the main surface 112 of the first layer 110. This can have the advantage that, in examples such as that shown in FIG. 4, in which the charge zone 180 is arranged in the first layer 110, the source contact 372 and the drain contact 374 are particularly close to the charge zone 180, and therefore good electrical contact is ensured.

In examples, the electronic component 300 further comprises an insulating layer 478 which is arranged between the gate electrode 370 and the second layer 120. The insulating layer 478 electrically insulates the gate electrode 370 from the second layer 120. This can prevent leakage currents between the gate electrode 370 and the charge zone 180. The insulating layer 478 can also be implemented, in an analogous manner, in the example of the electronic component 300 shown in FIG. 3.

In other words, for a design of the in the electronic component 300 as a transistor, the source and drain electrodes can be applied either to the first (FIG. 4) or to the second layer (FIG. 3), such that the 2DEG is contacted either directly or via one of the layers. These electrodes can consist of conductors such as Pt, Mo, Al, Ti, TiN, NbN, W, Ni, Au, or doped Si. In order to bring about a shift of the 2DEG away from the boundary surface between the two layers 110, 120 of the heterostructure, which is typically subject to defects, a further thin crystalline layer, e.g. the third layer 330, can be inserted in addition between the two layers 110, 120 of the heterostructure, which third layer also has a wurtzite structure.

Figure 5:
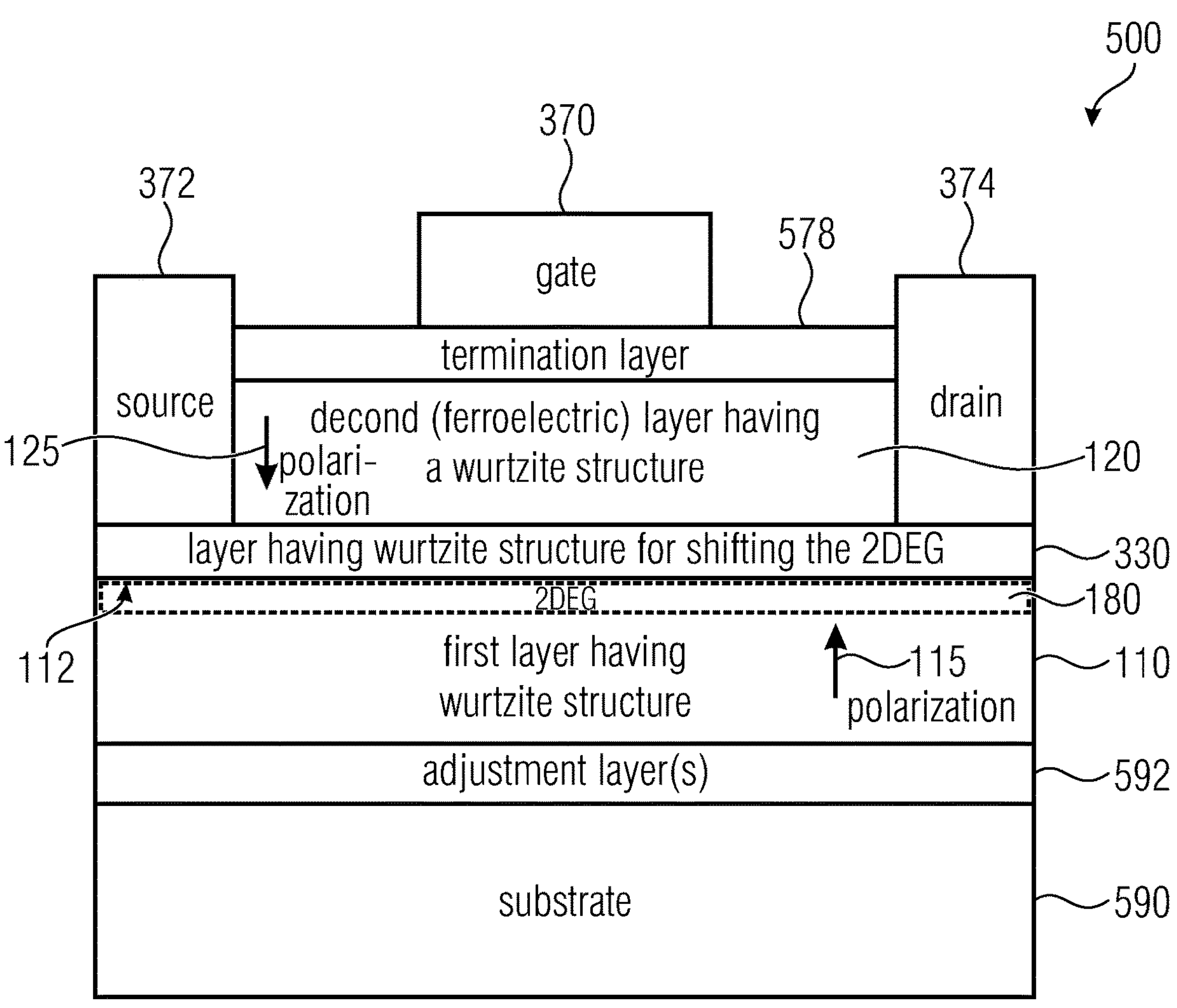
FIG. 5 is a schematic view of a HEMT according to one embodiment.

FIG. 5 is a schematic view of a HEMT 500 according to a further embodiment. Examples of the HEMT 500 can correspond to one of the electronic components 100, 200, 300 described above. The HEMT 500 comprises a substrate 590, which is arranged opposite the first layer 110 and the second layer 120, such that the first layer 110 is arranged between the substrate 590 and the second layer 120. Furthermore, the HEMT 500 contains one or more adjustment layers 592 which are arranged between the first layer 110 and the substrate 590. The adjustment layers 590 can bring about an adjustment of the lattice constant of the substrate 590 and of the first layer 110, such that defects and/or stress at a further main surface of the first layer 110 opposite the main surface 112 of the first layer 110 can be reduced or prevented. The HEMT 500 comprises the third layer 330, which is arranged between the first layer 110 and the second layer 120. A termination layer 578, which may be electrically insulating, is arranged between the gate electrode 370 and the second layer 120. A source contact 372 and a drain contact 374 are arranged adjoining the main surface 112 of the first layer 110. If the charge zone 180, which, in the example shown, is located along the main surface 112 of the first layer 110, is in a conductive state, the source contact 372 and the drain contact 374 are electrically connected via the charge zone 180.

Figure 8:
FIG. 8 is a flow diagram of a method for controlling an electronic component according to one embodiment.
Figure 8:
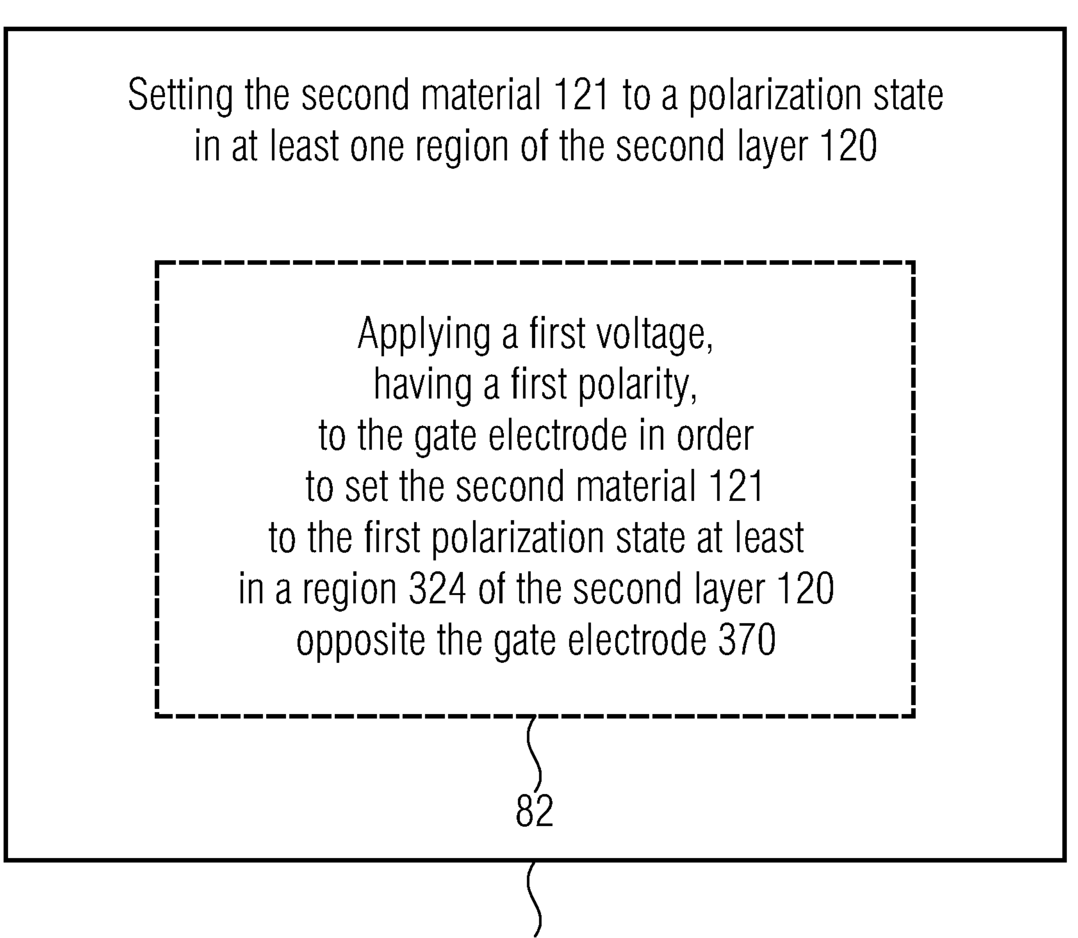

FIG. 8 is a flow diagram of a method 80 for controlling the electronic component 100, 200, 300, 500 according to FIG. 1 to FIG. 5. The method 80 includes a step 81 of setting the second material 121, in at least one region of the second layer 120, to the one polarization state.

In examples, the step 81 can include a step 82, or can be carried out by means thereof. The step 82 includes applying a first voltage, having a first polarity, to the gate electrode, in order to set the second material 121 to the first polarization state, at least in a region 324 of the second layer 120 opposite the gate electrode 370.

In examples, the method 80 further comprises a step of applying a second voltage, having a second polarity, to the gate electrode 370, in order to set the second material 121 to the second polarization state, at least in the region 324 of the second layer 120 opposite the gate electrode.

In examples, the electronic component 100, 200, 300, 500 according to FIG. 1 to FIG. 5 comprises a control unit which can carry out the method 80, for example by controlling a voltage applied to the gate electrode 370.

Figure 6:
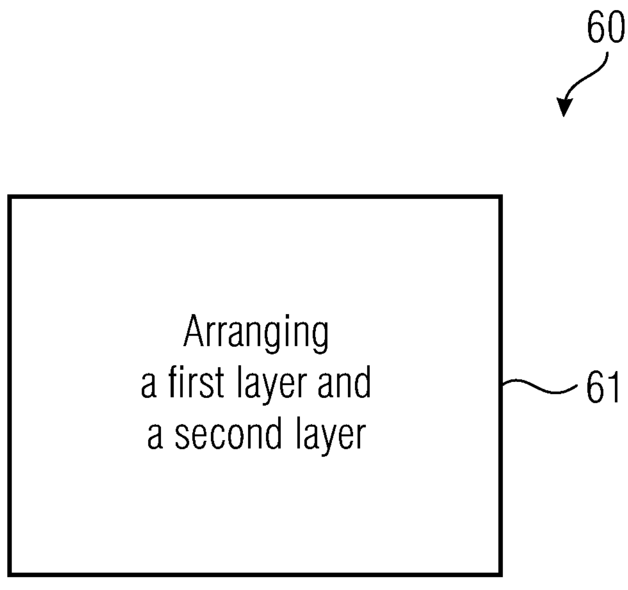
FIG. 6 is a flow diagram of a method for producing an electronic component according to one embodiment.

FIG. 6 is a flow diagram of a method 60 for producing an electronic component, for example the electronic component 100, 200, 300, 500. The method 60 includes a step 61 of arranging a first layer and a second layer. The arrangement 61 takes place such that a main surface 122 of the second layer 120 is arranged opposite a main surface 112 of the first layer 110. Furthermore, the arrangement 61 takes place such that the first layer 110 comprises a first material 111, and the second layer 120 comprises a second material 121. The second material 121 has at least one polarization state. The arrangement 61 takes place such that a polarization of the first material 111 faces in a first direction, and such that the direction of the polarization of the second material 121, at least in the one polarization state of the second material 121, is at least in part opposite to the first direction such that a charge zone 180 forms along the main surface 112, 122 of the first layer 110 and/or the second layer 120, said charge zone being electrically conductive at least when the second material 121 is in the one polarization state.

In examples, the arrangement 61 of the first layer 110 and of the second layer 120 includes a step depositing the first layer and the second layer. In examples, first of all the first layer 110 is deposited, and the second layer 120 is deposited on the first layer 110, wherein prior to the deposition of the second layer 120 one or more further layers can be deposited on the first layer 110, for example the third layer 330. In other examples, first of all the second layer 120 is deposited, and the first layer 110 is deposited on the second layer 120, wherein prior to depositing the first layer 110 one or more further layers, for example the third layer 330, can be deposited.

In examples, the deposition can take place such that the second material 121 is in the one polarization state, after the deposition of the first layer and of the second layer.

In these examples, it is thus possible to achieve, by means of the deposition process, that the polarization direction 125 of the second material 121 is at least in part opposite the polarization direction 115 of the first material.

In other words, an inversion of the polarization directions can take place within the context of the deposition process, in that a defect is caused at the boundary of the two layers having a wurtzite structure (e.g. by briefly providing oxygen, magnesium silicon or germanium).

Figure 7:
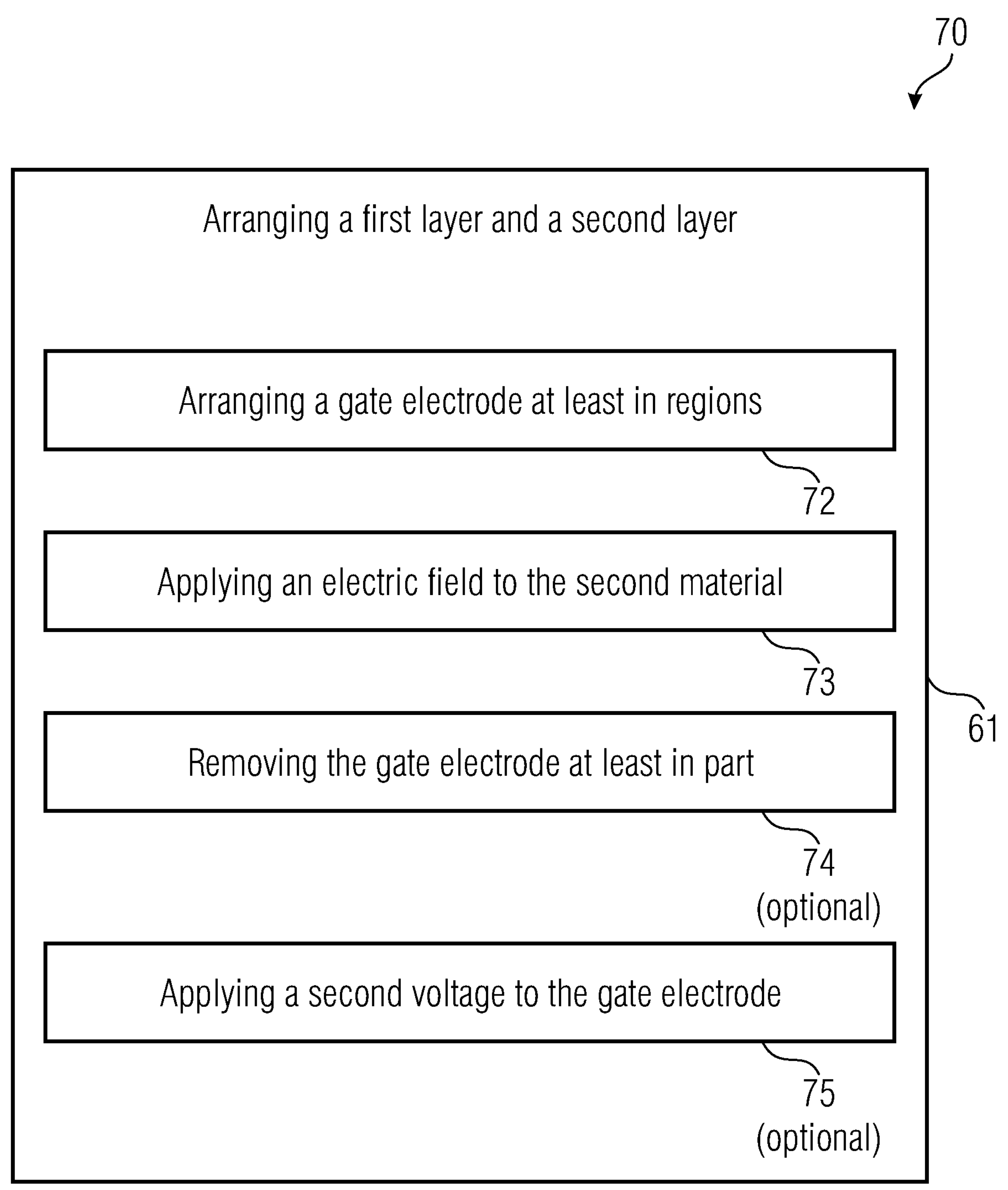
FIG. 7 is a flow diagram of a method for producing an electronic component according to a further embodiment.

FIG. 7 is a flow diagram of a method 70 according to one embodiment. The method 70 may be an example of the method 60. In these examples, the second material 121 is ferroelectric, such that a direction of a polarization of the second material can be changed. In these examples, the at least one polarization state of the second material is a first polarization state. In a second polarization state of the second material 121, the direction of the polarization of the second material 121 is at least in part aligned with the first direction. In these examples, the arrangement 61 further includes a step 73 of applying an electrical field to the second material 121 in a direction that is at least in part perpendicular to the main surface 112 of the first layer 110 or of the second layer 120 in order to set the second material 121 to the first polarization state, at least in regions.

For example, the arrangement 61 contains a step of depositing the first layer 110 and the second layer 120, as described with reference to FIG. 6, wherein depositing takes place in such a way that the polarization direction 115 of the first material 111 and the polarization direction 125, 125' of the second material are at least in part aligned, i.e. such that the second material is in the second polarization state. The step 73 can for example be carried out using a gate electrode, which can be arranged for example after the depositing the first and the second layer.

Accordingly, in examples, the arrangement 61 of the method 70 can further contain a step 72 of arranging a gate electrode 370, at least in regions. Step 72 is performed such that the second layer 120 is arranged between the first layer 110 and the gate electrode 370. Expediently, the step 72 can take place before the step 73.

If the method comprises the step 74, the step 72 of arranging the gate electrode can be carried out in such a way that the gate electrode extends over a region from the source contact to the drain contact. Thus, it is possible to ensure, in step 73, that the second material is set to the first polarization state, and thus a high conductivity can be achieved, over the entire region from the source contact to the drain contact. If, in step 73, the charge zone is used for applying the electrical field, the gate electrode 370 can be arranged in step 72 in such a way that it is electrically insulated from the source contact and the drain contact.

Optionally, the step 61 of the method 70 further includes a step 74 of at least partly removing the gate electrode, arranged in step 72. For example, the removal can take place in such a way that the gate electrode is electrically insulated from the source contact and the drain contact.

With reference to FIG. 3, it is thus possible to achieve that the second material 121 is in the first polarization state, in the region 326 which is outside the region 324 opposite the gate electrode 370. The second material 121 in the region 324 can be set to the first or the second polarization state, and thus the conductivity of the charge zone 180 can be increased or decreased, by applying a field to a remaining part of the gate electrode following step 74, represented in FIG. 3 by the gate electrode 370. Removing the gate electrode in part makes it possible to ensure that the gate electrode is electrically insulated from the source contact and the drain contact. Furthermore, a capacitance of the gate electrode can be reduced as a result.

In examples, the step 74 takes place such that the gate electrode is removed only in part, for example such that, after step 74, a remaining part of the gate electrode, for example the gate electrode 370, is arranged opposite the second layer 120. In these examples, the step 61 can furthermore contain a step 75 of applying a second voltage to the gate electrode 370, after the partial removal of the gate electrode, in order to set the second material 121 to the second polarization state at least in regions, for example in a region 324 opposite the remaining part of the gate electrode 73.

Thus, the second material can be in the second polarization state in a region 324 of the second layer 120, and in the first polarization state in a further region 326 of the second layer.

The method 60 from FIG. 6 and the method 70 from FIG. 7 may be suitable for producing the electronic component 100, 200, 300, 500. That is to say that the method 60, 70 can be configured in such a way that the features and effects described with reference to FIG. 1 to are achieved, for example with respect to the state and arrangement.

In other words, the ferroelectric effect constitutes a possibility for bringing about the inversion of the relative polarization directions of the first and second layer. A ferroelectric effect of this kind is observed in AlScN and can also be expected for GaScN and for other mixed crystals, such as AlMgNbN [9], [10]. This effect makes it possible to deposit a heterostructure of two layers having wurtzite structure having for example a metal-polar (alternatively nitrogen-polar) orientation. The polarization of the upper layer (alternative the lower) layer can be inverted by the ferroelectric effect. According to equation 2, the heterostructure thus created has a significantly increased conductivity. The application of a voltage can be achieved for example in that a conductive layer, e.g. Pt, Mo, Al, Ti, TiN, NbN, Ni, Au or Si (or a conductive substrate, e.g. doped Si or GaN) is brought into contact with the surface of a ferroelectric layer facing away from the 2DEG. Thereupon, a voltage can be applied on the other side of the ferroelectric layer, via this conductive layer and the 2DEG. This voltage inverts the polarization by means of the ferroelectric effect and thus increases the charge carrier density of the 2DEG. Thereupon, the conductive layer can be removed again or made smaller, in order for example to define a gate electrode for controlling the 2DEG.

Further embodiments will be described in the following:

One embodiment creates a structure consisting of a substrate, a crystalline layer that is applied thereto and has a wurtzite structure, and a further crystalline layer that is applied to the first layer and has a wurtzite structure, the polarization of which is oriented counter to the polarization of the first layer.

In examples of the structure, the conductivity along the boundary surface between the two layers is greater than in a structure in which the polarization of both layers faces in the same direction.

In examples, the charge carrier density has values between $6\times10^{13}$ $cm^{-2}$ and $164\times10^{13}$ $cm^{-2}$.

In examples, at least one of the two layers is ferroelectric.

In examples, at least one of the two layers is a group III nitride.

In examples, at least one of the two layers additionally contains a transition metal.

In examples, the second layer is thinner than 50 nm.

In examples, a further layer having a wurtzite structure is arranged between the first and the second layer.

In examples, a gate, a source, and a drain electrode are applied to the second layer.

In examples, the source and the drain electrode are applied to the first layer, and the gate electrode is applied to the second layer.

In examples, a further insulating layer is located between the gate and the second layer.

In examples, the transition metal portion is between 10 and 50% of the group III elements.

One embodiment provides a method in which a second crystalline layer having a wurtzite structure is applied to a first crystalline layer having a wurtzite structure, wherein the polarization of the two layers faces in the same direction, and at least one of the two layers is ferroelectric. Furthermore, in the case of the method, the conductivity of the boundary surface between the two layers is increased by applying a voltage to a part of one of the ferroelectric layers and the reversal of the polarization there.

One embodiment provides a method in which a second crystalline layer having a wurtzite structure is applied to a first crystalline layer having a wurtzite structure, wherein the polarization of the two layers faces in the same direction, and the second layer is ferroelectric; in which a conductive layer is applied to the ferroelectric layer, which covers at least 80% of the distance between the position of a (also subsequently applied) source and a drain electrode; in which the conductivity of the boundary surface between the layers is increased by applying a voltage to the conductive layer, and the reversal of the polarization there; and in which the conductive layer is subsequently at least partly removed.

One embodiment provides a method in which a second crystalline layer having a wurtzite structure is applied to a first crystalline layer having a wurtzite structure, wherein the polarization of the two layers faces in the same direction, and the second layer is ferroelectric; and in which the polarization of a ferroelectric layer according to either of claims 2-3 was inverted; and in which the polarization of a ferroelectric layer is inverted again by a gate electrode, in order to achieve a state having lower conductivity; and in which a voltage is applied to the gate electrode, in order to further deplete the 2DEG.

Although some aspects of the present disclosure have been described as features in conjunction with a device, it is clear that such a description can also be considered a description of corresponding method features. Although some aspects have been described as features in conjunction with a method, it is clear that such a description can also be considered a description of corresponding features of a device or the functionality of a device.

In the preceding detailed description, sometimes different features have been grouped together in examples, in order to rationalize the disclosure. This type of disclosure should not be interpreted as an intention for the claimed examples to comprise more features than explicitly specified in each claim. Rather, as the following claims show, the subject matter can be found in fewer than all the features of one single disclosed example. Consequently, the following claims are hereby incorporated into the detailed description, wherein each claim can also be considered an individual separate example. While each claim can stand as its own separate example, it is noted that, although dependent claims in the claims refer back to a specific combination with one or more other claims, other examples also comprise a combination of dependent claims with the subject matter of every other dependent claim, or a combination of every feature with other dependent or independent claims. Such combinations are included unless it is stated that a specific combination is not intended. Furthermore, it is intended that a combination of features of one claim with every other independent claim should be included, even if this claim is not directly dependent on the independent claim.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

REFERENCES

[1] O. Ambacher et al., "Two-dimensional electron gases induced by spontaneous and piezoelectric polarization charges in N- and Ga-face AlGaN/GaN heterostructures," J. Appl. Phys., vol. 85, no. 6, pp. 3222-3233, 1999, doi: 10.1063/1.369664.

[2] K. Frei et al., "Investigation of growth parameters for ScAlN-barrier HEMT structures by plasma-assisted MBE," Jpn. J. Appl. Phys., vol. 58, p. SC1045, 2019, doi: 10.7567/1347-4065/ab124f.

[3] S. Fichtner, N. Wolff, F. Lofink, L. Kienle, and B. Wagner, "AlScN: A III-V Semiconductor Based Ferroelectric," https://arxiv.org/abs/1810.07968.

[4] C. E. Dreyer, A. Janotti, C. G. Van de Walle, and D. Vanderbilt, "Correct implementation of polarization constants in wurtzite materials and impact on III-nitrides," Phys. Rev. X, vol. 6, no. 2, p. 021038, 2016, doi: 10.1103/PhysRevX.6.021038.

[5] M. Caro et al., "Piezoelectric coefficients and spontaneous polarization of ScAlN.," J. Phys. Condens. Matter, vol. 27, no. 24, p. 245901, 2015, doi: 10.1088/0953-8984/27/24/245901.

[6] F. Bernardini, V. Fiorentini, and D. Vanderbilt, "Spontaneous polarization and piezoelectric constants of III-V nitrides," Phys. Rev. B, vol. 56, no. 16, p. R10 024, 1997, doi: 10.1103/PhysRevB.56.R10024.

[7] I. Edward A. Beam and J. Xie, "High electron mobility transistor (HEMT) device," U.S. Pat. No. 10,636,881B2, 2016.

[8] L. Vegard, "Die Konstitution der Mischkristalle and die Raumfüllung der Atome," ["The makeup of mixed crystals and the space filling of the atoms"] Zeitschrift für Phys. [Physics journal], vol. 5, p. 17, 1921, doi: 10.1007/BF00549722.

[9] M. Uehara, T. Mizuno, Y. Aida, H. Yamada, K. Umeda, and M. Akiyama, "Increase in the piezoelectric response of scandium-doped gallium nitride thin films sputtered using a metal interlayer for piezo MEMS," Appl. Phys. Lett., vol. 114, no. 012902, 2019, doi: 10.1063/1.5066613.

[10] M. Uehara et al., "Giant increase in piezoelectric coefficient of AlN by Mg—Nb simultaneous addition and multiple chemical states of Nb," Appl. Phys. Lett., vol. 111, no. 11, p. 112901, 2017.

The invention claimed is:

1. An electronic component, comprising a first layer and a second layer, wherein a main surface of the first layer is arranged opposite a main surface of the second layer, wherein the main surface of the first layer is arranged adjacent to the main surface of the second layer, or wherein the electronic component further comprises a third layer arranged adjacent to the main surface of the first layer and arranged adjacent to the main surface of the second layer, wherein the third layer comprises a wurtzite crystal structure, wherein the first layer comprises a polarized first material, and wherein a polarization of the first material faces in a first direction, and wherein the second layer comprises a polarized second material in one polarization state in which a direction of a polarization of the second material is at least in part opposite to the first direction so that a charge zone forms along the main surface of the first and/or the second layer, said charge zone being electrically conductive.

2. The electronic component according to claim 1, wherein the first material comprises a wurtzite crystal structure, and wherein the second material comprises a wurtzite crystal structure.

3. An electronic component, comprising a first layer and a second layer, wherein a main surface of the first layer is arranged opposite a main surface of the second layer, wherein the first layer comprises a first material with a wurtzite crystal structure, and wherein a polarization of the first material faces in a first direction, and wherein the second layer comprises a second material with a wurtzite crystal structure, wherein the second material comprises a transition metal, wherein the second material is ferroelectric and comprises at least one polarization state, wherein a direction of a polarization of the second material at least in the one polarization state of the second material is at least in part opposite to the first direction, so that a charge zone is formed along the main surface of the first and/or second layer, said charge zone being electrically conductive at least when the second material is in the one polarization state, and wherein the one polarization state of the second material is a first polarization state and wherein the direction of the polarization of the second material in a second polarization state of the second material is at least in part aligned with the first direction, and wherein the electronic component is configured to set the second material of the second layer to the first polarization state, at least in regions.

4. The electronic component according to claim 3, wherein a charge carrier density of a charge zone along the main surface of the first layer and/or the second layer is more than $1^{012}$ $cm^{-2}$ or more than $10^{13}$ $cm^{-2}$ or more than $6\times10^{13}$ $cm^{-2}$, or is in a range between $10^{13}$ $cm^{-2}$ and $800\times10^{13}$ $cm^{-2}$, or in a range between $6\times10^{13}$ $cm^{-2}$ and $800\times10^{13}$ $cm^{-2}$, or is in a range between $10\times10^{13}$ $cm^{-2}$ and $800\times10^{13}$ $cm^{-2}$, when the second material is in the one polarization state.

5. The electronic component according to claim 3, wherein the first material is a nitrogen compound that comprises at least one group III element, and/or the second material is a nitrogen compound that comprises at least one group III element.

6. The electronic component according to claim 3, wherein the second material is a nitrogen compound that comprises one or more group III elements and furthermore comprises a transition metal.

7. The electronic component according to claim 6, wherein a stoichiometric proportion of the transition metal in the nitrogen compound of the second material is between 10% and 50% of a total stoichiometric proportion of the one or more group III elements and the transition metal in the nitrogen compound.

8. The electronic component according to claim 3, wherein the first material is one of GaN, GaScN, AlScN, AlN, InGaN, InGaScN, AlGaN, AlGaScN, and/or wherein the second material is one of AlscN, AlGaScN, GaScN, AlN, AlGaN, AlMgNbN, AlGaN, AlGaScN.

9. The electronic component according to claim 3, wherein a combination of second material/first material is one of the following: AlScN/GaN, AlScN/GaScN, AlGaScN/GaN, GaScN/AlScN, GaScN/AlN, AlScN/InGaN, AlScN/InGaScN, AlMgNbN/GaN.

10. The electronic component according to claim 3, wherein the second material is ferroelectric so that the direction of the polarization of the second material can be changed, wherein the one polarization state of the second material is a first polarization state, and wherein the direction of the polarization of the second material in a second polarization state of the second material is at least in part aligned with the first direction.

11. The electronic component according to claim 10, wherein a charge carrier density of a charge zone along the main surface of the first layer and/or the second layer is greater when the second material is in the first polarization state than when the second material is in the second polarization state.

12. The electronic component according to claim 3, further comprising a third layer arranged between the first layer and the second layer and comprising a wurtzite crystal structure.

13. The electronic component according to claim 3, wherein the second layer comprises a thickness of less than 50 nm.

14. The electronic component according to claim 3, further comprising a source contact and a drain contact, wherein the charge zone is arranged in series between the source contact and the drain contact.

15. The electronic component according to claim 3, further comprising a gate electrode, wherein the second layer is arranged between the first layer and the gate electrode.

16. The electronic component according to claim 15, wherein the gate electrode is arranged opposite the second layer only in regions.

17. The electronic component according to claim 15, further comprising an electrically insulating layer arranged between the gate electrode and the second layer.

18. The electronic component according to claim 15, wherein the second material is ferroelectric so that the direction of the polarization of the second material can be changed, wherein the one polarization state of the second material is a first polarization state, and wherein the direction of the polarization of the second material in a second polarization state of the second material is at least in part aligned with the first direction, and wherein the gate electrode is configured to set the second material to the first polarization state, at least in a region of the second layer opposite the gate electrode, by applying a first voltage, comprising a first polarity, to the gate electrode, and to set the second material to the second polarization state, at least in the region of the second layer opposite the gate electrode, by applying a second voltage, comprising a second polarity, to the gate electrode.

19. The electronic component according to claim 18, wherein the second material is configured to maintain a most recently set polarization state, in a state of the electronic component in which no voltage is applied to the gate electrode.

20. The electronic component according to claim 18, wherein the direction of the polarization of the first material is oriented in such a way that the second polarity is a negative polarity.

21. Method A method for controlling the electronic component according to claim 3, wherein the method comprises:

setting the second material, in at least one region of the second layer, to the one polarization state.

22. The method according to claim 21, wherein the second material is ferroelectric so that the direction of the polarization of the second material can be changed, wherein the one polarization state of the second material is a first polarization state, and wherein the direction of the polarization of the second material in a second polarization state of the second material is at least in part aligned with the first direction, wherein the electronic component further comprises a gate electrode, wherein the second layer is arranged between the first layer and the gate electrode, and wherein the setting the second material to the first polarization state comprises:

applying a first voltage, comprising a first polarity, to the gate electrode, in order to set the second material to the first polarization state, at least in a region of the second layer opposite the gate electrode.

23. A method for producing an electronic component, comprising:

arranging a first layer and a second layer, such that a main surface of the second layer is arranged opposite a main surface of the first layer, and such that the main surface of the first layer is arranged adjacent to the main surface of the second layer, or such that the electronic component further comprises a third layer which is arranged adjacent to the main surface of the first layer and is arranged adjacent to the main surface of the second layer, wherein the third layer comprises a wurtzite crystal structure, such that the first layer comprises a first material, and the second layer comprises a second material, wherein the second material comprises at least one polarization state, and such that a polarization of the first material faces in a first direction, such that the direction of the polarization of the second material at least in the one polarization state of the second material is at least in part opposite to the first direction so that a charge zone forms along the main surface of the first layer and/or the second layer, said charge zone being electrically conductive at least when the second material is in the one polarization state.

24. The method according to claim 23, wherein arranging the first layer and the second layer comprises depositing the first layer and the second layer, wherein depositing takes place in such a way that the second material is in the one polarization state, after depositing the first layer and the second layer.

25. The method according to claim 23, wherein the second material is ferroelectric so that the direction of a polarization of the second material can be changed, wherein the one polarization state of the second material is a first polarization state, and wherein the direction of the polarization of the second material in a second polarization state of the second material is at least in part aligned with the first direction, and wherein the method further comprises:

applying an electrical field to the second material in a direction that is at least in part perpendicular to the main surface of the first or second layer in order to set the second material to the first polarization state, at least in regions.

26. The method according to claim 25, wherein the method further comprises:

arranging a gate electrode, at least in regions, such that the second layer is arranged between the first layer and the gate electrode, and wherein applying the electrical field to the second material is carried out by applying a voltage to the gate electrode.

27. The method according to claim 26, further comprising:

at least partly removing the gate electrode after the second material has been set to the first polarization state at least in regions.

28. The method according to claim 27, wherein removing the gate electrode takes place only in part, wherein the voltage is a first voltage, and wherein the method further comprises:

applying a second voltage to the gate electrode, after a partial removal of the gate electrode, in order to set the second material to the second polarization state at least in regions.

* * * * *